United States Patent [19]
Radens et al.

[11] Patent Number: 5,928,967
[45] Date of Patent: Jul. 27, 1999

[54] SELECTIVE OXIDE-TO-NITRIDE ETCH PROCESS USING $C_4F_8$/CO/AR

[75] Inventors: Carl J. Radens, Poughkeepsie; Cynthia A. Fairchok, Verbank, both of N.Y.

[73] Assignee: International Business Machines Corporation, Armonk, N.Y.

[21] Appl. No.: 08/662,754

[22] Filed: Jun. 10, 1996

[51] Int. Cl.[6] .................... H01L 21/3065; H01L 21/473
[52] U.S. Cl. ........................................... 438/740; 438/743
[58] Field of Search .................................. 438/740, 738, 438/743, 744, 723, 724, 710; 216/67, 72, 80, 79

[56] References Cited

U.S. PATENT DOCUMENTS

| | | | |
|---|---|---|---|
| 4,324,611 | 4/1982 | Vogel et al. | 156/643 |
| 4,352,724 | 10/1982 | Sugishima et al. | 204/192 |
| 4,493,745 | 1/1985 | Chen et al. | 156/626 |
| 4,502,914 | 3/1985 | Trumpp et al. | 156/643 |
| 4,528,438 | 7/1985 | Poulsen et al. | 219/121 PE |
| 4,668,338 | 5/1987 | Maydan et al. | 156/643 |
| 5,013,692 | 5/1991 | Ide et al. | 437/241 |
| 5,147,500 | 9/1992 | Tachi et al. | 156/643 |
| 5,173,151 | 12/1992 | Namose | 156/643 |
| 5,176,790 | 1/1993 | Arleo et al. | 156/643 |
| 5,259,922 | 11/1993 | Yamano et al. | 156/643 |
| 5,266,154 | 11/1993 | Tatsumi | 156/643 |
| 5,286,344 | 2/1994 | Blalock et al. | 156/657 |
| 5,288,367 | 2/1994 | Angell et al. | 156/626 |
| 5,294,289 | 3/1994 | Heinz et al. | 156/626 |
| 5,302,236 | 4/1994 | Tahara et al. | 156/643 |
| 5,328,557 | 7/1994 | Blalock | 156/643 |
| 5,338,399 | 8/1994 | Yanagida | 156/662 |
| 5,356,515 | 10/1994 | Tahara et al. | 156/643 |
| 5,366,590 | 11/1994 | Kadonnara | 156/662 |
| 5,369,061 | 11/1994 | Nagayama | 437/228 |
| 5,399,237 | 3/1995 | Keswick et al. | 156/643 |
| 5,554,557 | 9/1996 | Koh | 437/52 |
| 5,578,524 | 11/1996 | Fukase et al. | 437/195 |
| 5,595,627 | 1/1997 | Inazawa et al. | 156/643.1 |
| 5,606,188 | 2/1997 | Bronner et al. | 257/301 |
| 5,631,179 | 5/1997 | Sung et al. | 438/264 |
| 5,650,339 | 7/1997 | Saito et al. | 437/21 |
| 5,700,737 | 12/1997 | Yu et al. | 438/636 |
| 5,702,981 | 12/1997 | Maniar et al. | 437/192 |
| 5,721,090 | 2/1998 | Okamoto et al. | 430/313 |
| 5,801,094 | 9/1998 | Yew et al. | 438/624 |
| 5,811,357 | 9/1998 | Armacost et al. | 438/723 |
| 5,866,485 | 2/1999 | Kirchhoff et al. | 438/740 |

FOREIGN PATENT DOCUMENTS

| | | |
|---|---|---|
| 797242 | 9/1997 | European Pat. Off. . |
| 805475 | 11/1997 | European Pat. Off. . |
| 805485 | 11/1997 | European Pat. Off. . |
| 813245 | 12/1997 | European Pat. Off. . |

OTHER PUBLICATIONS

Declaration from U.S. Patent application serial No. 07/779,376, filed Oct. 18, 1991, entitled: Method of Etching Object to be Processessed Including Oxide or Nitride Portion. Inventor: Yoshifumi Tahara et al., USP 5,302,236.

*Primary Examiner*—Marion McCamish
*Assistant Examiner*—Cheryl Juska
*Attorney, Agent, or Firm*—Schmeiser, Olsen & Watts; Jay Anderson

[57] ABSTRACT

A dry etch process for use in the fabrication of integrated circuits which use SiN etch stop layers is disclosed. The process is conducted in a reactive-ion etch reactor and employs a gaseous etchant mixture comprised of octaflourocyclobutane ($C_4F_8$), carbon monoxide (CO) and Ar. The specific process parameters effect the formation of a polymer on SiN but not on oxide, thereby resulting in a very high etch rate selectivity of the oxide to the nitride.

7 Claims, 3 Drawing Sheets

SELECTIVE OXIDE-TO-NITRIDE ETCH PROCESS USING $C_4F_8/CO/AR$

BACKGROUND OF THE INVENTION

1. Technical Field

This invention relates generally to the manufacture of semiconductor integrated circuits, and more specifically to a dry etch process for use with devices having a silicon nitride (SiN) etch stop layer. The process yields a high etch rate selectivity of oxide to nitride (i.e., the ratio of the etch rate of the oxide to the etch rate of the SiN) and thereby provides an advantage in the fabrication of borderless contact structures. The chemical etching process is carried out in a reactive ion etch reactor, utilizing a gaseous etchant mixture comprising a carbon-fluoride gas having the formula $C_4F_8$, an inert gas, preferably Ar and optionally, carbon oxide gas, CO.

2. Background Art

The cell size of dynamic random access memories (DRAMs) can be decreased by as much as 40% by using bitline contacts that are borderless to wordlines. A feature integral to the formation of borderless contacts is the use of etch stop layers, an example of which is silicon nitride, $Si_3N_4$ (SiN).

The SiN etch stop process is the most promising method for forming borderless contacts on devices with dimensions below 0.5 $\mu$m. Due to these narrow contact dimensions, a very thin SiN etch stop layer is used in order to maximize contact area and minimize contact resistance. Therefore, a very high etch rate selectivity between oxides, such as phospho-silicate glass and SiN is required for the fabrication of integrated circuits that use SiN etch stop layers.

High oxide to SiN etch rate selectivity has previously been obtained using process chemistries such as $C_2F_6$ and $C_3F_8$. These processes have been performed on unique, and/or one-of-a-kind process tools which have not found wide acceptance in the microelectronics manufacturing industry. In addition, the ability to selectively etch oxide over nitride when the underlying SiN topography was not flat, i.e., has greater than one depth, has been a technologic roadblock.

It is known in the prior art that the manufacture of multilayer structures typically involves patterned etching of areas of the semiconductor surface which are covered by a photoresist protective material. One well known etching technique is reactive ion etching (RIE). This process involves positioning a semiconductor wafer in a reaction chamber and feeding etchant gases into the chamber. The etchant gases are dissociated in an RF field so that ions contained in the etchant gases are accelerated to the wafer surface. The accelerated ions combine chemically with unmasked material on the wafer surface. As a result, volatile etch product is produced and is incorporated into the plasma. The concentration of the volatile etch product can be tracked in order to determine the end-point of the RIE process, i.e., when the chemical reaction has removed the desired level of material from the wafer surface. During the RIE process, a single layer or multiple layers of material or film may be removed. These materials may include, for example, SiN, PSG, silicon dioxide ($SiO_2$) and poly-silicon (PSi).

U.S. Pat. No. 5,266,154, issued Nov. 30, 1993 to Tatsumi, discloses a dry etch method which can be applied to contact hole formation in which octafluorocyclobutane is used as the etching gas to etch an $SiO_2$ inter-layer insulation film.

U.S. Pat. No. 5,286,344, issued Feb. 15, 1994 to Blalock et al., discloses a process for selectively etching a layer of $SiO_2$ on an underlying stop layer of SiN. This process utilizes a fluorinated chemical etchant system, comprising an etchant material and an additive material. The additive material comprises a fluorocarbon material in which the number of hydrogen atoms is equal to or greater than the number of fluorine atoms. Preferably, the additive material is $CH_2F_2$. The etchant material comprises at least one of $CHF_3$, $CF_4$ or Ar.

U.S. Pat. No. 5,173,151, issued Dec. 22, 1992 to Namose, discloses a dry chemical etching method for etching one or more deposited Si or $SiO_2$ layers, utilizing an etching medium comprised of $C_nF_{2n+2}$, wherein n is an integer, and an inert gas, such as He or Ar.

U.S. Pat. No. 5,176,790 issued Jan. 5, 1993 to Arleo et al., teaches a process for etching through an insulation layer over a metal layer, without an etch stop layer, on a semiconductor wafer which comprises plasma etching the insulation layer with a fluorine-containing gaseous etchant mixture. The mixture will include one or more 3–6 carbon fluorinated hydrocarbon gases either alone or in combination with one or more nitrogen-containing gases.

U.S. Pat. No. 5,302,236, issued on Apr. 12, 1994 to Tahara et al., discloses a method of etching an oxide or nitride film with a gaseous etchant mixture of a fluorine-containing gas and a sufficiently greater volume of carbon monoxide gas.

None of the prior art teaches a dry etch process for creating borderless contacts in small dimensional structures utilizing silicon nitride etch stop layers. Previous process chemistries, such as $C_2F_6$ and $C_3F_8$, which have been utilized to provide high oxide-nitride etch rate selectivity have found application only with unique, or one-of-a-kind process tools.

Therefore, there existed a need to provide a process for use in fabricating small sized structures utilizing silicon nitride etch stop liners, which results in a high etch selectivity between oxide and the nitride liner.

DISCLOSURE OF INVENTION

According to the present invention, a dry etch process is disclosed for the fabrication of borderless contacts in devices using silicon nitride etch stop layers. The process has been demonstrated for devices having contact dimensions as narrow as 0.18 to 0.25 $\mu$m. The process results in high etch selectivity between oxides, such as phospho and boro phosphosilicate glass, and the SiN etch stop layer.

The process utilizes a $C_4F_8/CO/Ar$ chemical etchant mixture in a reactive ion etch (RIE) reactor and results in the formation of a polymer which deposits on the nitride liner, but not on the oxide. The stoichiometry of the polymer is a result of the gaseous etchant mixture and process parameters of the etch. The specific combination employed in the dry etch of the present invention maximizes the concentration of C-rich species such as $C_2F_4$, which provide high selectivity, and minimizes the concentration of F-rich species, such as $CF_3$, which result in low selectivity. Following the selective reactive-ion etch of the oxide layer, the SiN layer is removed by means such as a $CHF_3$, $CF_4/O_2$ RIE.

In preparing the gate stack, silicon nitride is the preferable gate cap. This allows the use of a much thinner silicon nitride etch stop liner, as the gate cap provides extra protection against erosion during the oxide chemical the sidewalls of the gate stack, contact area is increased and contact resistance is decreased. If $SiO_2$ were instead used as the gate cap, a much thicker nitride liner is required.

Due to the greatly increased selectivity of oxide to nitride, the process of the present invention has an important application in the etching of an integrated circuit structure where the underlying topography is not flat.

The foregoing and other objects, features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

Figure 1A:
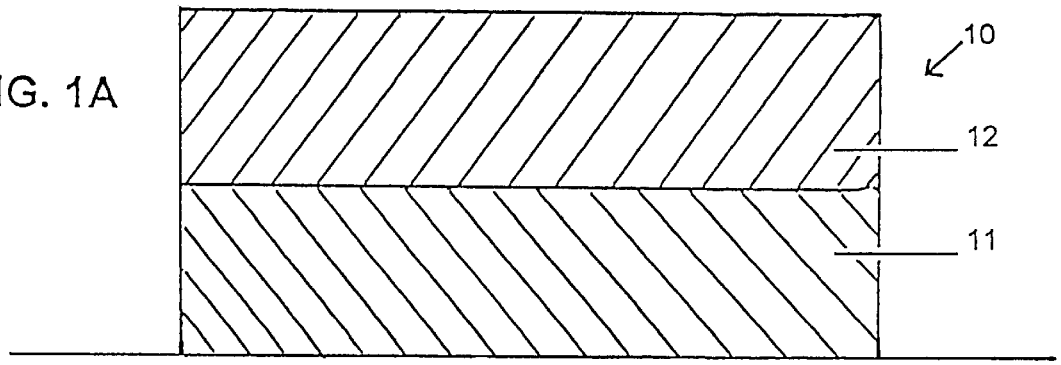
FIG. 1A is a schematic representation of the gate stack of the integrated circuit structure (ICS) of the present invention.

Referring to the figures, FIG. 1A illustrates a gate stack 10 which is comprised of a first underlying film 11 and a gate cap 12. In the preferred embodiment, first underlying film 11 is comprised of polysilicon, alone or with a layer of tungsten silicide and gate cap 12 is comprised of SiN.

Figure 1B:
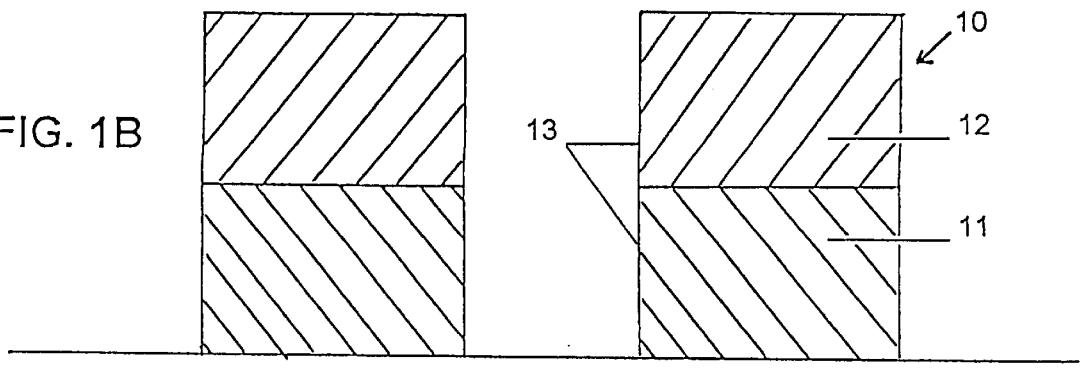
FIG. 1B is a schematic representation of the gate stack of the ICS of the present invention following the gate etch.
Figure 2:
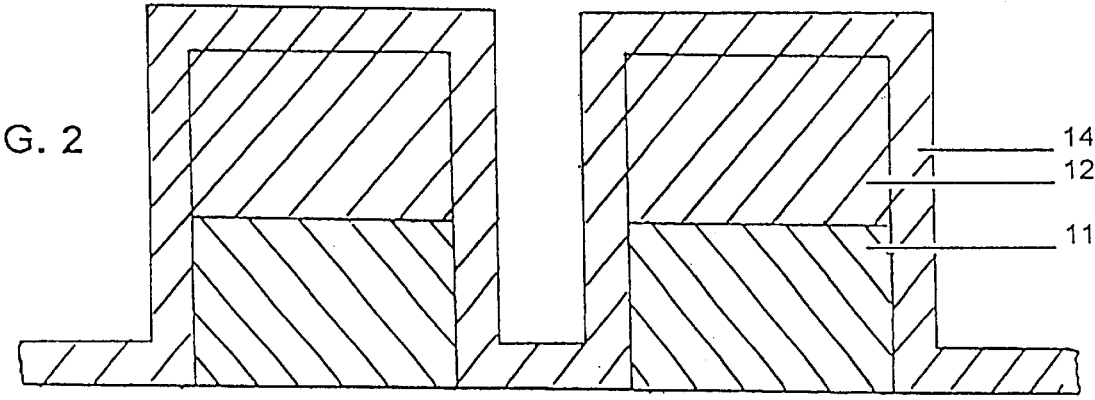
FIG. 2 is a schematic representation of the ICS following the deposition of the SiN liner.
Figure 3:
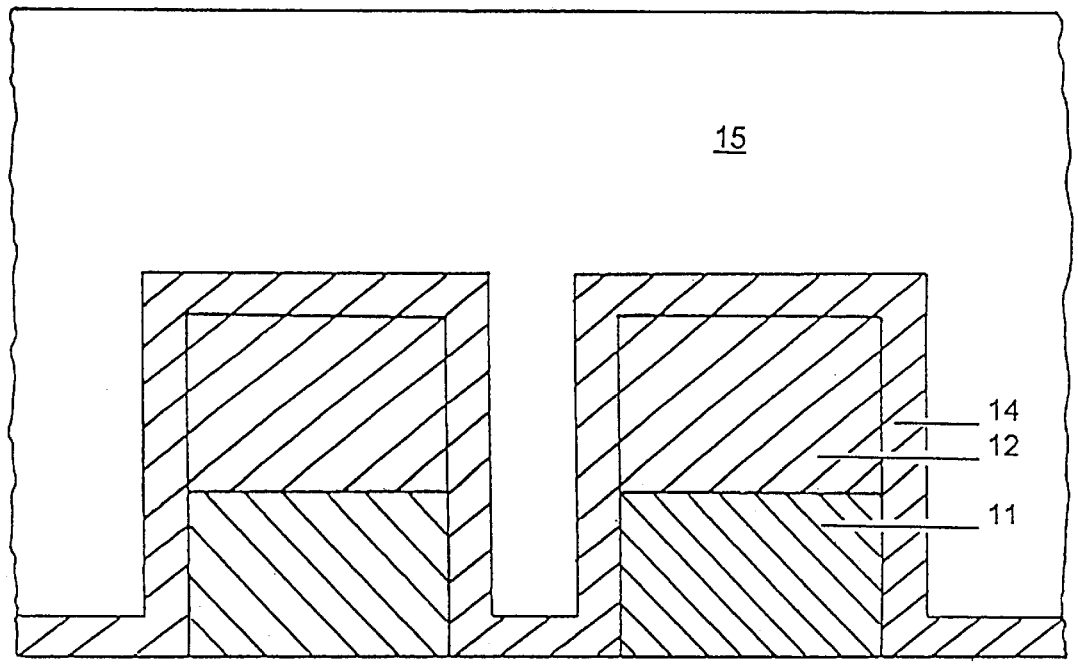
FIG. 3 is a schematic representation of the ICS following the deposition and planarization of the oxide.

To initiate the process, gate stack 10 is etched and the resulting sidewalls 13 of gate stack 10 are oxidized, FIG. 1B, followed by the deposition of a thin SiN liner 14, FIG. 2. In an alternate embodiment, a thin SiN spacer may be deposited and etched along sidewalls 13 prior to the deposition of SiN liner 14. Next, an upper layer 15 of oxide, e.g., phosphsilicate glass or borophosphosicate glass, is deposited by means such as low pressure chemical vapor deposition, FIG. 3. Optionally, upper layer 15 may then be planarized by means such as chemical-mechanical polishing. Following the planarization, deep UV lithography is used to form borderless contact patterns in the oxide.

Figure 4:
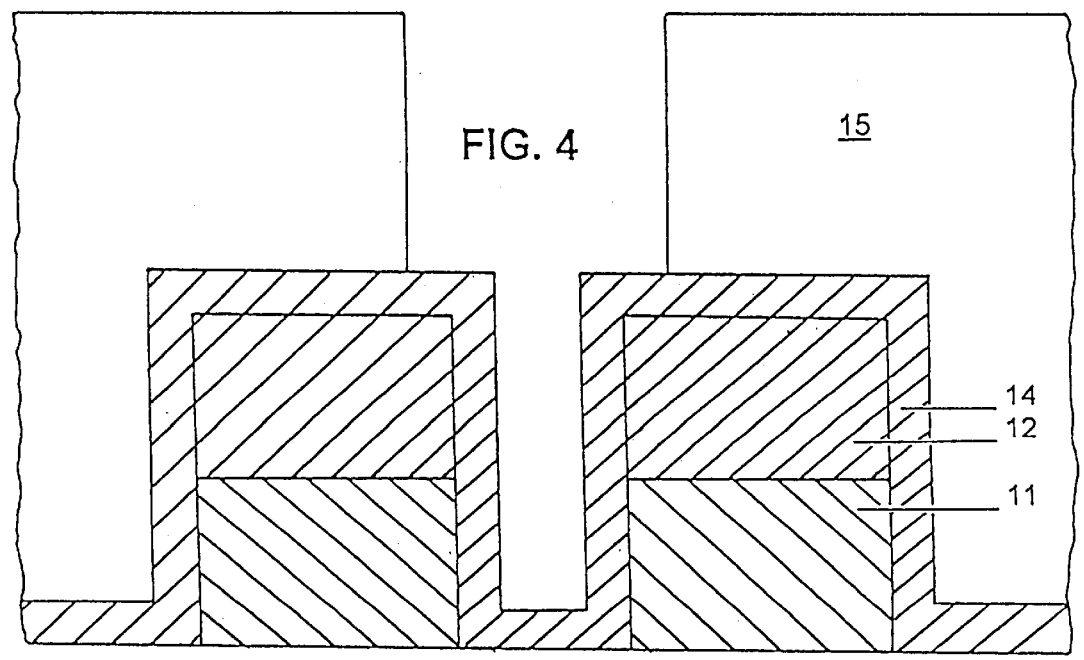
FIG. 4 is a schematic representation of the ICS following the oxide etch.
Figure 5:
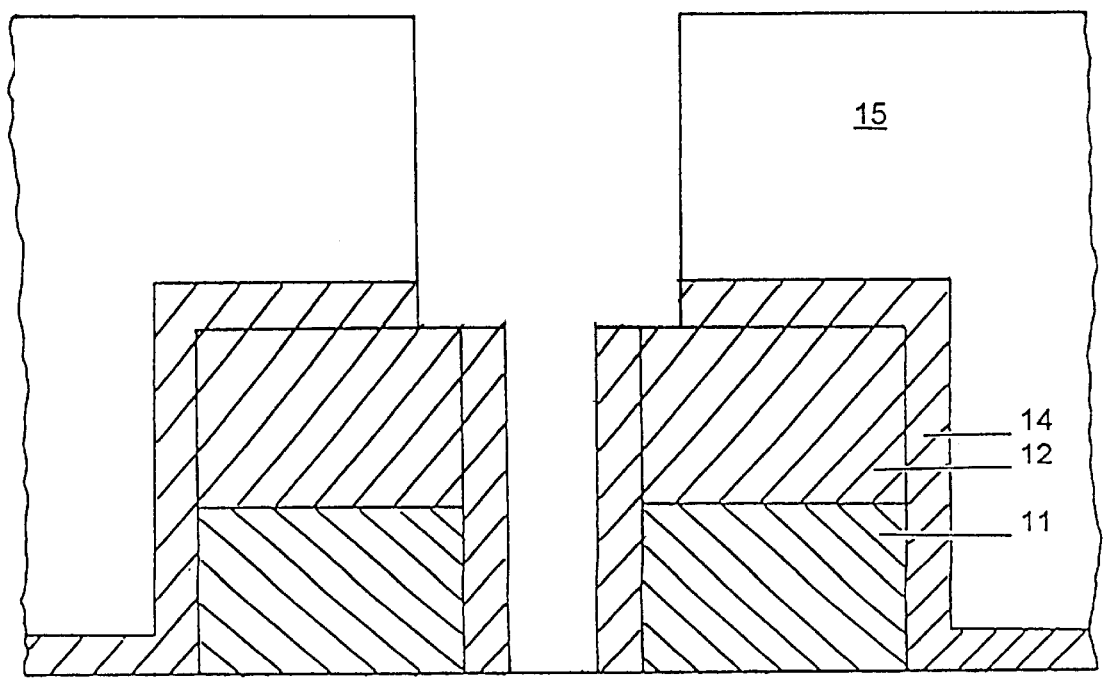
FIG. 5 is a schematic representation of the ICS following the etch/removal of the SiN liner.

After the formation of the contact patterns, upper oxide layer 15 is dry etched with very high selectivity to nitride liner 14, FIG. 4. The etch is conducted in a reactive ion etch reactor (e.g. an AME5000, manufactured by Applied Materials) utilizing a gas etchant mixture comprising $C_4F_8$/CO/Ar. The preferred process parameters for the oxide etch are as follows:

600–1100 W rf. Power at 13.6 MHz to the cathode

30–125 mT

0–100 gauss

4–20 sccm $C_4F_8$

0–200 sccm CO

50–250 sccm Ar

0–60° C. cathode temperature

20–65° C. chamber wall temperature quartz-ring electrostatic chuck or vespel-ring clamp Optical emission endpoint at 3865 Å

The composition of the etchant gas mixture is within the following ranges: $C_4F_8$, 0.5 to 5%; CO, 0 to 78%; and Ar, 18 to 97%. Although the presence of CO is not mandatory, it does provide a distinct advantage, namely, the ability to etch high aspect ratio features. The addition of an inert gas, preferably, Ar, to the etchant gas mixture provides an etching that is substantially vertical, i.e., without a taper. Other inert gases, such as the noble gases He, Kr, Xe and Ne, may also be used. Without the inert gas, a purely fluorinecontaining etchant gas typically will result in a etch that is tapered inwardly toward the bottom by as much as 20° from the vertical.

Following the etch of oxide layer 15, SiN liner 14 is anisotropically etched, such that SiN liner 14 is removed from the horizontal surfaces of gate stack 10, but not from gate stack sidewalls 13.

While the invention has been particularly shown and described with reference to a preferred exemplary embodiment thereof, it will be understood by those skilled in the art that various changes in form and details may be made therein without departing from the spirit and scope of the invention.

We claim:

1. A dry etch process for use in the fabrication of an integrated circuit structure having a silicon nitride etch stop layer, said process comprising the steps of:

providing a semiconductor wafer having a plurality of gate stacks etched thereon, said gate stacks including a silicon nitride etch stop layer;

depositing an oxide layer over said silicon nitride etch stop layer; and etching said oxide layer in an etch chamber of a reactive-ion etch reactor by means of a gas etchant mixture including delivering $C_4F_8$ to said etch chamber at a flow rate within a range of 4 to 20 sccm; delivering CO to said etch chamber at a flow rate within a range of 0 to 200 sccm; and delivering an inert gas to said etch chamber at a flow rate within a range of 50 to 250 sccm.

2. The dry etch process of claim 1 wherein said inert gas is Ar.

3. The process of claim 1, wherein the oxide is a resist masked dielectric oxide.

4. A dry etch process for use in the fabrication of an integrated circuit structure having a silicon nitride etch stop layer, said process comprising the steps of:

providing a semiconductor wafer having a plurality of gate stacks etched thereon, said gate stacks including a silicon nitride cap;

depositing a silicon nitride layer on said semiconductor wafer;

depositing an oxide layer over said silicon nitride liner;

etching said oxide layer in an etch chamber of a reactive-ion etch reactor by means of a gas etchant mixture including delivering $C_4F_8$ to said etch chamber at a flow rate within a range of 4 to 20 sccm, delivering CO to said etch chamber at a flow rate within a range of 0 to 200 sccm, and delivering an inert gas to said etch chamber at a flow rate within a range of 50 to 250 sccm; and etching said silicon nitride layer.

5. The dry etch process of claim 4 wherein said inert gas is Ar.

6. The dry etch process of claim 4 further including, after the step of depositing an oxide layer over said silicon nitride layer, the steps of:

planarizing said oxide layer; and creating borderless contact patterns in said planarizing oxide layer.

7. The process of claim 4, wherein the oxide is a resist masked dielectric oxide.

* * * * *